United States Patent
Aiba et al.

(10) Patent No.: US 7,343,547 B2
(45) Date of Patent: Mar. 11, 2008

(54) SEMICONDUCTOR INTEGRATED CIRCUIT, AND SEMICONDUCTOR SYSTEM INCLUDING THAT SEMICONDUCTOR INTEGRATED CIRCUIT

(75) Inventors: Kimihiko Aiba, Osaka (JP); Yoichiro Mae, Osaka (JP); Hisato Yoshida, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 336 days.

(21) Appl. No.: 10/549,118

(22) PCT Filed: Feb. 8, 2005

(86) PCT No.: PCT/JP2005/001805

§ 371 (c)(1),
(2), (4) Date: Sep. 14, 2005

(87) PCT Pub. No.: WO2005/076022

PCT Pub. Date: Aug. 18, 2005

(65) Prior Publication Data

US 2006/0282721 A1 Dec. 14, 2006

(30) Foreign Application Priority Data

Feb. 9, 2004 (JP) .............................. 2004-031746

(51) Int. Cl.
*G06F 11/00* (2006.01)
*G01R 31/28* (2006.01)

(52) U.S. Cl. ...................... 714/799; 714/724; 714/736; 714/738

(58) Field of Classification Search ...................... None
See application file for complete search history.

(56) References Cited

U.S. PATENT DOCUMENTS

| 6,119,250 A * | 9/2000 | Nishimura et al. ......... 714/718 |
| 7,093,143 B2 * | 8/2006 | Ito et al. ..................... 713/300 |
| 2003/0237036 A1 | 12/2003 | Kimura |

FOREIGN PATENT DOCUMENTS

JP 11-305991 11/1999

* cited by examiner

*Primary Examiner*—Phung M. Chung
(74) *Attorney, Agent, or Firm*—McDermott Will & Emery LLP

(57) ABSTRACT

For detecting a failure of a logic circuit 11 provided in a semiconductor integrated circuit due to deterioration with age, or the like, there is provided a reference-producing circuit 12 using a logic different from the logic of the logic circuit 11. The reference-producing circuit 12 produces an abnormal/normal determination reference S for a predetermined output signal out output from the logic circuit 11. The reference-producing circuit 12 is made from only a portion of the logic of the logic circuit 11 or with a logic totally different from the logic of the logic circuit 11 to produce the determination reference S, so that the circuit scale of the reference-producing circuit 12 is smaller than that of the logic circuit 11. The determination reference S from the reference-producing circuit 12 and the output signal out from the logic circuit 11 are compared with each other by a determination circuit 13.

7 Claims, 9 Drawing Sheets

SEMICONDUCTOR INTEGRATED CIRCUIT, AND SEMICONDUCTOR SYSTEM INCLUDING THAT SEMICONDUCTOR INTEGRATED CIRCUIT

This application is the U.S. National Phase under 35 U.S.C. §371 of International Application No. PCT/JP05/001805, filed Feb. 8, 2005, which in turn claims the benefit of Japanese Application No. 2004-031746, filed Feb. 9, 2004, the disclosures of which Applications are incorporated by reference herein in their entirety.

TECHNICAL FIELD

The present invention relates to a semiconductor integrated circuit, and more particularly to the detection of a failure of a logic circuit provided therein.

BACKGROUND ART

Generally, semiconductor integrated circuits for which high reliability is required are subjected to in-depth failure inspection before shipping, and only those that are ensured for normal operation are used in products. However, even those semiconductor integrated circuits may fail after shipping due to deterioration with age, or the like.

A conventional technique described in Patent Document 1 is a method for detecting a failure of a semiconductor integrated circuit due to deterioration with age, or the like. With this technique, separately from a logic circuit that is provided in the semiconductor integrated circuit and subjected to failure inspection, another logic circuit of the same configuration is provided as a mirror circuit, and the outputs of these logic circuits are compared with each other, determining that there is an error when the outputs differ from each other. The failure detection method is called a "mirror circuit method".

Patent Document 1: Japanese Laid-Open Patent Publication No. 11-305991

DISCLOSURE OF THE INVENTION

Problems to be Solved by the Invention

However, with the conventional mirror circuit method, it is necessary to provide, separately from each logic circuit subjected to failure inspection, another logic circuit of the same configuration, thus increasing the circuit area.

The present invention has been made to solve the problem, and has an object to provide a determination reference for failure detection that allows for the detection of a failure of a logic circuit provided in a semiconductor integrated circuit without providing a mirror circuit and while keeping the circuit scale small.

Means for Solving the Problems

In order to achieve the object set forth above, it is assumed in the present invention that it is generally sufficient, as an inspection for a failure due to deterioration with age, to inspect a logic circuit for a failure only for a particular state of the inspected logic circuit, e.g., a state where the inspected logic circuit is performing an important function. The present invention produces a small-scale circuit for reproducing the particular state, e.g., a state where an important function is performed, of the inspected logic circuit, using a different logic from the logic of the inspected logic circuit, thereby detecting an abnormality in the output signal of the inspected logic circuit by using the output signal of the produced circuit as the determination reference.

Specifically, a semiconductor integrated circuit of the present invention includes: a logic circuit producing at least a predetermined output signal with a logic and outputting the predetermined output signal; a reference-producing circuit for producing a determination reference for the predetermined output signal, wherein the reference-producing circuit is made from a different logic from the logic of the logic circuit and with a smaller circuit scale than that of the logic circuit; and a determination circuit for receiving a determination reference produced by the reference-producing circuit to detect an abnormality in the predetermined output signal from the logic circuit based on the determination reference, wherein if an abnormality is detected, the determination circuit determines that the logic circuit has failed and outputs an error signal.

In the semiconductor integrated circuit of the present invention, the reference-producing circuit produces the determination reference with the same logic as a portion of the logic of the logic circuit.

In the semiconductor integrated circuit of the present invention, the reference-producing circuit produces the determination reference with a logic totally different from the logic of the logic circuit.

In the semiconductor integrated circuit of the present invention, the reference-producing circuit also produces a determination period signal specifying a period during which the detection of an abnormality in the predetermined output signal from the logic circuit should be performed; and the determination circuit performs the detection of an abnormality in the predetermined output signal from the logic circuit based on the determination reference from the reference-producing circuit only while the determination period signal is being output.

The semiconductor integrated circuit of the present invention includes a conversion circuit for, in response to the error signal output from the determination circuit, externally outputting the determination reference produced by the reference-producing circuit as the predetermined output signal, instead of the predetermined output signal from the logic circuit.

The semiconductor integrated circuit of the present invention includes a CPU for operating the logic circuit; and an interruption circuit for halting an operation of the CPU in response to the error signal output from the determination circuit.

A semiconductor system of the present invention includes: the semiconductor integrated circuit as described above; a CPU for operating the logic circuit provided in the semiconductor integrated circuit; and an interruption circuit for halting an operation of the CPU in response to the error signal output from the determination circuit provided in the semiconductor integrated circuit.

Thus, when an inspected logic circuit is brought to a particular state, e.g., a state where an important function is performed, to output a predetermined output signal, a determination reference for the predetermined output signal is produced and output from a reference-producing circuit, based on which a determination circuit detects an abnormality in the predetermined output signal, and an error signal is output when an abnormality is detected.

The reference-producing circuit is made from a logic different from the logic of the inspected logic circuit, and can be a small-scale circuit for producing only the determination reference for the predetermined determination signal from the inspected logic circuit. Therefore, it is possible to detect a failure of the inspected logic circuit with no practical problems without using a mirror circuit as in the prior art.

Particularly, in the present invention, the determination circuit detects an abnormality in the predetermined output signal from the inspected logic circuit based on the determination reference only during a determination period in which the determination period signal is output from the reference-producing circuit, whereby there is no problem even if the reference-producing circuit erroneously produces the determination reference in periods other than the determination period. Therefore, as compared with a case where there is provided a reference-producing circuit having a complicated configuration for ensuring that no determination reference is produced in periods other than the determination period, it is possible to simplify the configuration of the reference-producing circuit, whereby it is possible to further reduce the circuit scale of the reference-producing circuit.

Effects of the Invention

As described above, in the present invention, a failure of the inspected logic circuit due to deterioration with age, or the like, can be detected with a small-scale reference-producing circuit for producing the determination reference without using a mirror circuit. Therefore, the detection of a failure of an inspected logic circuit due to deterioration with age, or the like, can be realized with a minimal increase in the circuit area and a minimal increase in the power consumption.

Particularly, the detection of an abnormality in the predetermined output signal from the logic circuit based on the determination reference from the reference-producing circuit is performed only during the determination period, whereby it is possible to further reduce the circuit scale of the reference-producing circuit.

DESCRIPTION OF REFERENCE NUMERALS

| | |
|---|---|
| 10, 40 | Semiconductor integrated circuit |
| 11, 20, 41 | Logic circuit |
| 12, 21, 42 | Reference-producing circuit |
| 13, 43 | Determination circuit |
| 14, 44 | Conversion circuit |
| 15, 45 | Interruption circuit |
| 16, 46 | CPU |
| S | Determination reference signal (determination reference) |
| T | Determination period signal |
| Er | Error signal |

BEST MODE FOR CARRYING OUT THE INVENTION

Embodiments of the present invention will now be described with reference to the drawings.

First Embodiment

Figure 1:
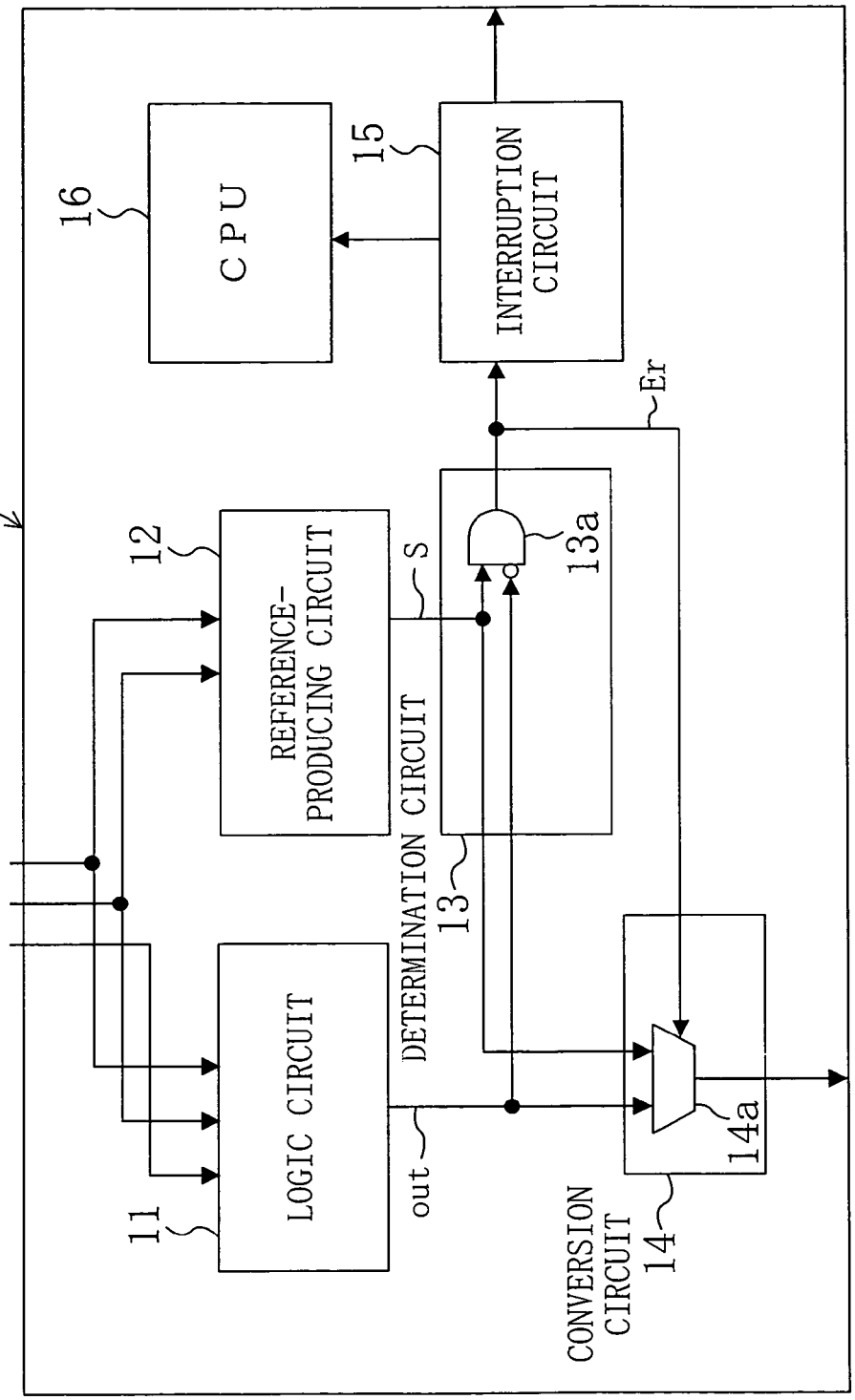
FIG. 1 is a block diagram showing a semiconductor integrated circuit according to a first embodiment of the present invention.
Figure 3:
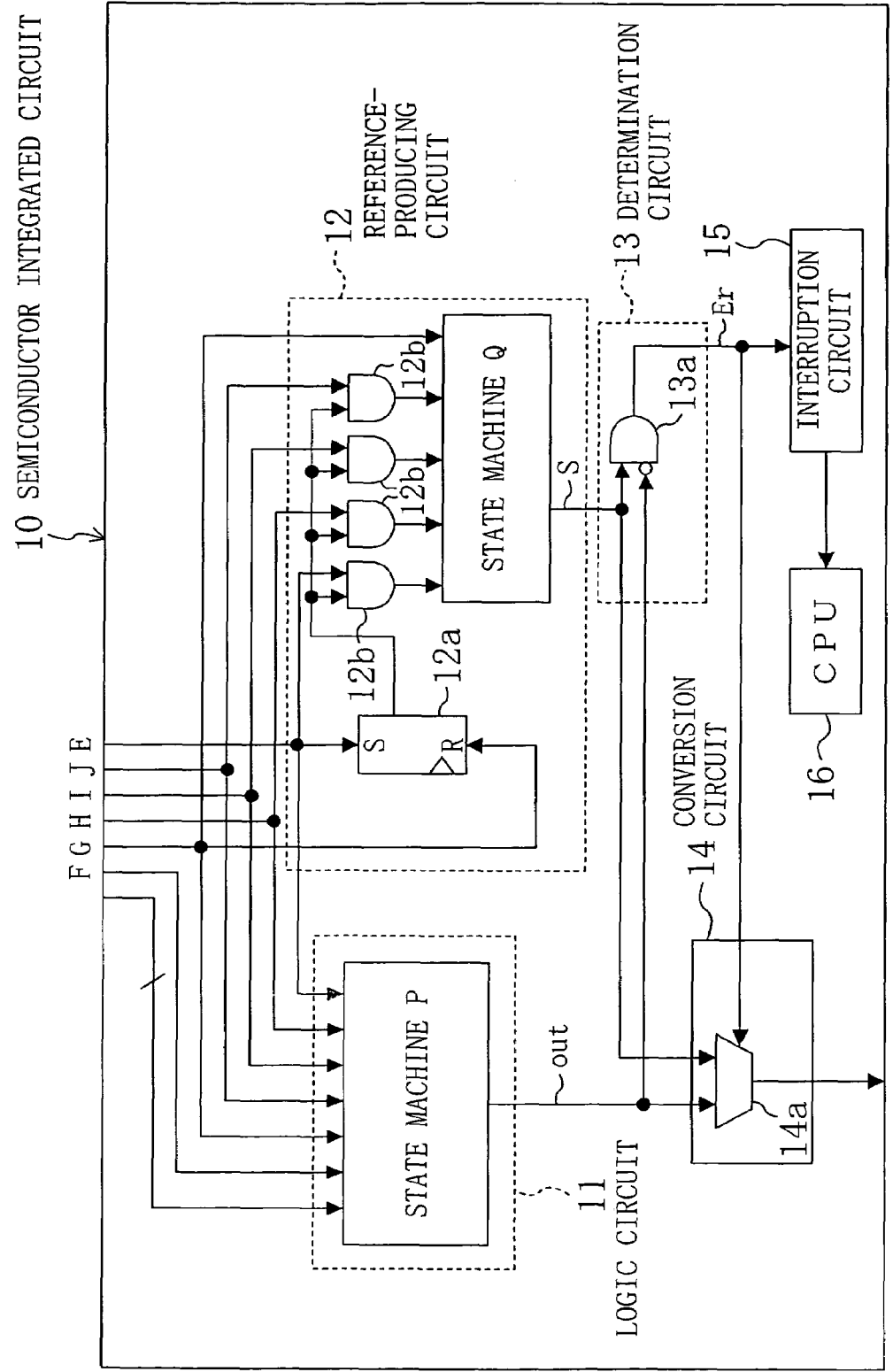
FIG. 3 shows a specific configuration of the semiconductor integrated circuit.

FIG. 1 and FIG. 3 are block diagrams showing a semiconductor integrated circuit according to a first embodiment of the present invention.

Referring to the figures, a semiconductor integrated circuit 10 includes therein a logic circuit 11 subjected to failure inspection, and a reference-producing circuit 12 provided in parallel to the logic circuit 11 for producing a determination reference based on which a failure of the logic circuit 11 is detected.

Figure 2:
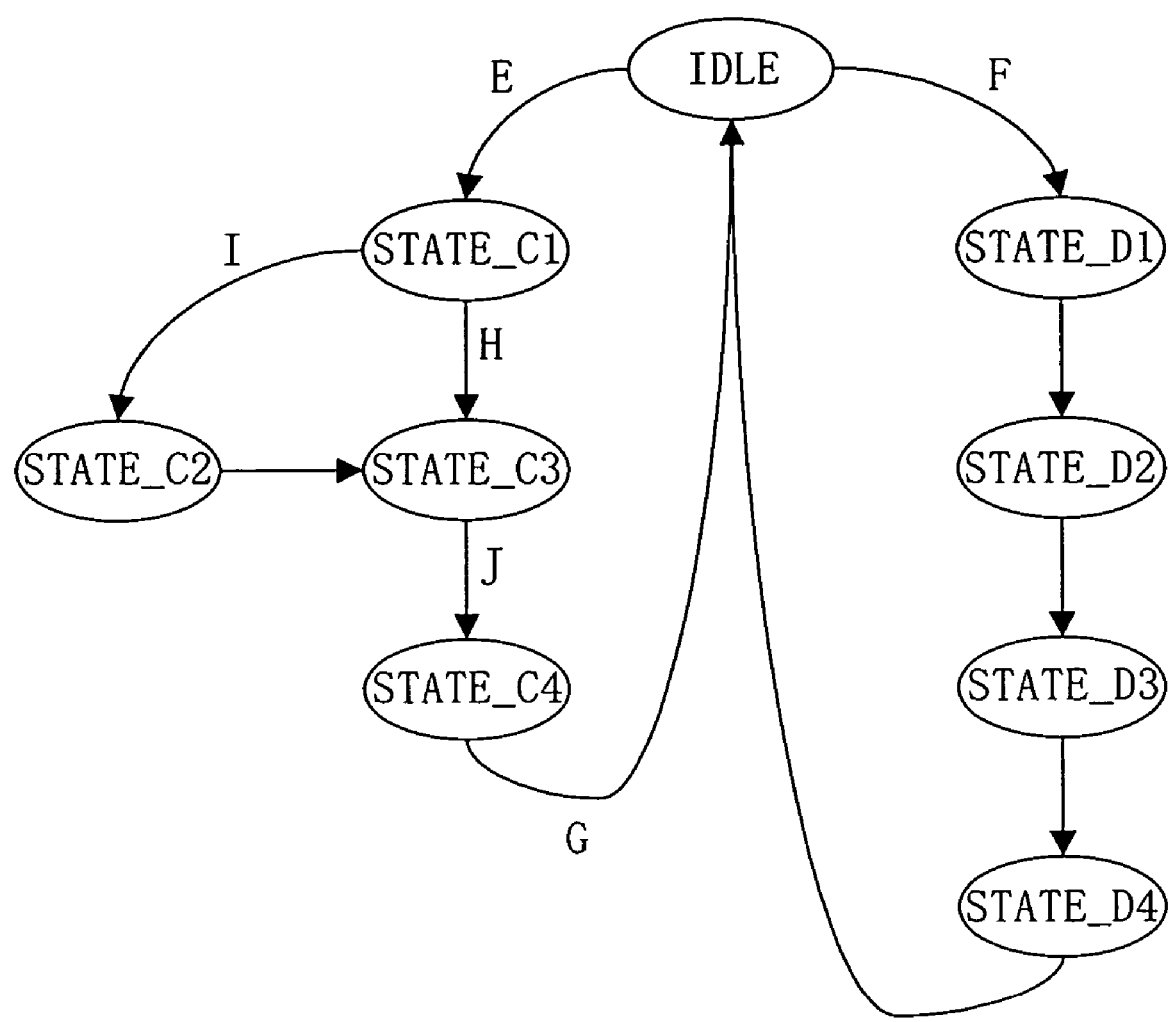
FIG. 2 shows a bubble chart of a state machine of a logic circuit provided in the semiconductor integrated circuit.

First, a configuration of the inspected logic circuit 11 will be described. FIG. 2 shows a bubble chart of a state machine in the logic circuit 11. The state machine being in the IDLE state transitions to a state STATE_C1 in response to an E signal and to a state STATE_D1 in response to an F signal. In response to a G signal, the state machine being in a state STATE_C4 transitions to the IDLE state. The G signal is input only when the state machine is in the state STATE_C4.

Referring to FIG. 3, a state machine P in the logic circuit 11 is a circuit that does all the transitions shown in the bubble chart of FIG. 2. Where the left half of the bubble chart of FIG. 2, i.e., the transitions from the IDLE state to the states STATE_C1 to STATE_C4, is functionally important to the logic circuit 11, a state machine Q in the reference-producing circuit 12 is a circuit that does only those transitions in the left half. Thus, the logic of the reference-producing circuit 12 is different from the logic of the inspected logic circuit 11, and is equal to a portion of the entire logic of the logic circuit 11.

The semiconductor integrated circuit 10 shown in detail in FIG. 3 receives six input signals E to J. The inspected logic circuit 11 receives all of the input signals E to J, whereas the reference-producing circuit 12 receives only the input signals E and G to J corresponding to the left half of the bubble chart of FIG. 2, i.e., the transitions from the IDLE state to the states STATE_C1 to STATE_C4, and does not receive the signal F. In addition to the state machine Q, the reference-producing circuit 12 of FIG. 3 includes a flip-flop circuit 12a and four 2-input AND circuits 12b. The AND circuits 12b receive the four input signals E and H to J corresponding to the transitions in the left half of the bubble chart shown in FIG. 2. The flip-flop circuit 12a is set when the signal E is asserted and reset when the signal G is asserted. The output from the flip-flop circuit 12a is commonly input to the four AND circuits 12b. The outputs from the four AND circuits 12b and the signal G are input to the state machine Q.

With the flip-flop circuit 12a and the four AND circuits 12b, the signal E and the signals H, I and J are allowed to be input to the state machine Q after the signal E is input so that the state machine Q is transitioned from the IDLE state to the states STATE_C1 to STATE_C4. Then, when the signal G is input, the signals E and H to J are blocked from being input to the state machine Q, whereby the state machine Q is transitioned from the state STATE_C4 to the IDLE state. Therefore, when the signal G is input, the state machine Q outputs a determination reference S for an output signal (predetermined output signal) out as the inspected logic circuit 11 being in the IDLE state outputs the output signal out.

Note that where the input signal J is, for example, a signal for a transition in the right half of the bubble chart of FIG. 2, the flip-flop circuit 12a and the four AND circuits 12b serve to prevent a malfunction by preventing the state machine Q from erroneously producing and outputting the determination reference S other than when the signal G is input (i.e., other than when the determination reference S is supposed to be output).

The output signal out from the logic circuit 11 and the determination reference S from the reference-producing circuit 12 are input to a determination circuit 13. The determination circuit 13 includes a 2-input AND circuit 13a for receiving the determination reference S from the reference-producing circuit 12 at one input terminal thereof and receiving an inverted output signal obtained by inverting the output signal out from the logic circuit 11 at the other input terminal thereof so as to output the logical product of the two signals as a determination result. The AND circuit 13a outputs a logical value of 0 if the output signal out from the logic circuit 11 matches with the determination reference S from the reference-producing circuit 12, and the AND circuit 13a outputs an error signal Er having a logical value of 1 if the signals do not match with each other, thus detecting a failure of the logic circuit 11 due to deterioration with age, or the like.

The error signal Er from the determination circuit 13 is sent to a conversion circuit 14 and an interruption circuit 15. In the conversion circuit 14, the error signal Er from the determination circuit 13 is input to a selector circuit 14a. The selector circuit 14a selects and outputs the output signal out from the logic circuit 11 when the error signal Er from the determination circuit 13 is not asserted and the logical value thereof is 0. When the error signal Er is asserted and the logical value thereof is 1, the selector circuit 14a selects and outputs the determination reference S from the reference-producing circuit 12, instead of the output signal out from the logic circuit 11. Therefore, when the output signal out from the logic circuit 11 is abnormal, i.e., when the logic circuit 11 has failed due to deterioration with age, or the like, the determination reference S from the reference-producing circuit 12 (the normal output signal out that is supposed to be output from the logic circuit 11) is externally output from the semiconductor integrated circuit 10.

When a failure of the logic circuit 11 is detected with the error signal Er from the determination circuit 13 being asserted, the interruption circuit 15 receiving the error signal Er outputs, to a CPU 16 for controlling the operation of the logic circuit 11, a signal that triggers an interruption routine for halting the operation of the CPU 16. The CPU 6 receives the signal from the interruption circuit 15, and stops its operation at the end of the interruption routine. Thus, it is possible to prevent a malfunction due to the failure of the logic circuit 11.

In the present embodiment, the reference-producing circuit 12 for producing the determination reference S is made from the left half of the logic of the logic circuit 11 shown in the bubble chart of FIG. 2, but not with the entire logic thereof. Therefore, as compared with a case where a mirror circuit of the same configuration as that of the logic circuit 11 is separately provided as in the prior art, the reference-producing circuit 12 has a smaller circuit scale, and it is thus possible to detect a failure of the inspected logic circuit 11 due to deterioration with age, or the like, with no practical problems with a small circuit scale.

Variation

In the first embodiment, the circuit scale is reduced by detecting a failure due to deterioration with age, or the like, only for important functions of the logic circuit, where the important functions can be clearly distinguished from other functions thereof that are not so important.

However, the present invention is not limited to cases where important functions of the logic circuit can be clearly distinguished from other functions thereof, and is similarly applicable to cases where the logic circuit implements a series of various functions and where a failure is detected only for important functions included in the series of functions. An example of such a case will now be described.

Figure 4:
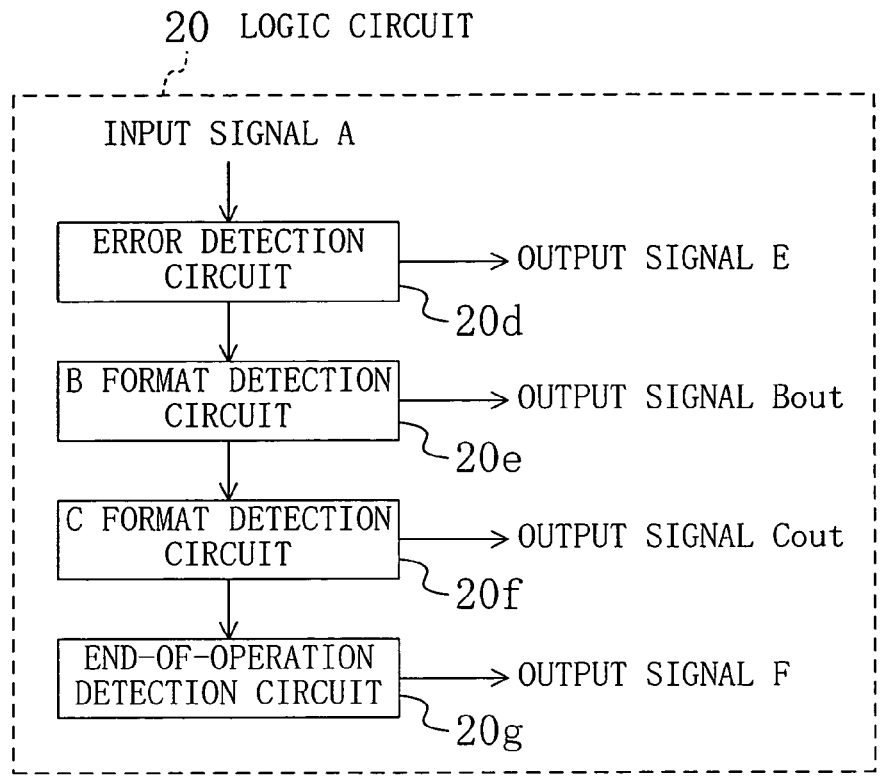
FIG. 4 shows a specific example of the logic circuit provided in the semiconductor integrated circuit.
Figure 5:
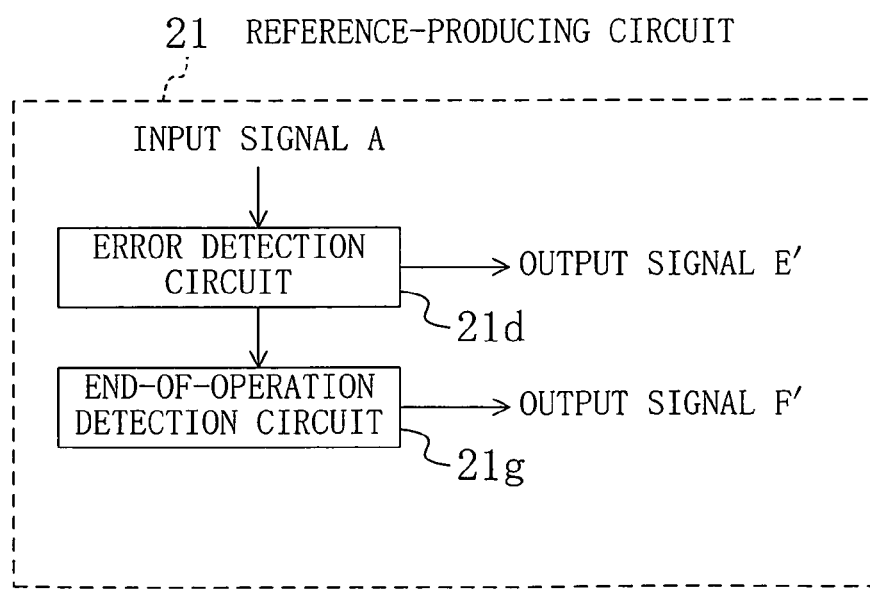
FIG. 5 shows a configuration of a reference-producing circuit for producing a determination reference signal for an output signal from the logic circuit shown in FIG. 4.

FIG. 4 is a block diagram showing an inspected logic circuit 20. FIG. 5 is a block diagram showing a reference-producing circuit 21 for producing a determination reference. The logic circuit 20 of FIG. 4 includes an error detection circuit 20d, a B format detection circuit 20e, a C format detection circuit 20f and an end-of-operation detection circuit 20g. When the logic circuit 20 receives an input signal A, the four circuits 20d to 20g each perform a predetermined operation according to the input signal A and provide output signals E, Bout, Cout and F. A specific example is as follows. For example, if the input signal A has a value of 4'b0000, the error detection circuit 20d determines that the input signal A is an error and asserts the output signal E. If the input signal A has a value of 4'b0101, the B format detection circuit 20e determines that the input signal A has a B format and asserts an output signal Bout. If the input signal A has a value of 4'b1010, the C format detection circuit 20f determines that the input signal A has a C format and asserts an output signal Cout. If the input signal A has a value of 4'b1111, the end-of-operation detection circuit 20g detects the end of the operation and asserts the output signal F.

The reference-producing circuit 21 of FIG. 5 includes an error detection circuit 21d and an end-of-operation detection circuit 21g, corresponding to components of the logic circuit 20 that perform important operations for implementing the function of the logic circuit 20. In the reference-producing circuit 21, if the input signal A has a value of 4'b0000, the error detection circuit 21d determines that the input signal A is an error and asserts an output signal E', and if the input signal A has a value of 4'b1111, the end-of-operation detection circuit 21g detects the end of the operation and asserts an output signal F'. The reference-producing circuit 21 gives no output if the input signal A has a value other than these two values.

In this variation, a failure of the logic circuit 20 due to deterioration with age, or the like, is detected by determining, at the determination circuit 13 of FIG. 3, whether the output signal E from the error detection circuit 20d of the logic circuit 20 matches with the output signal E' from the error detection circuit 21d of the reference-producing circuit 21, and determining, at the determination circuit 13, whether the output signal F from the end-of-operation detection circuit 20g of the logic circuit 20 matches with the output signal F' from the end-of-operation detection circuit 21g of the reference-producing circuit 21.

Therefore, again in this variation, a failure is detected only for the error detection circuit 20d and the end-of-operation detection circuit 20g, being important ones of the functions of the logic circuit 20, whereby it is possible to effectively reduce the circuit scale of the reference-producing circuit 21.

Note that the variation has been described above assuming that the error detection circuit 20d of the logic circuit 20 has the same logic as the logic of the error detection circuit 21d of the reference-producing circuit 21, and the end-of-operation detection circuit 20g of the logic circuit 20 has the same logic as the logic of the end-of-operation detection circuit 21g of the reference-producing circuit 21. Alternatively, the reference-producing circuit 21 may be separately and independently designed with a logic totally different from the logic of the logic circuit 20 so as to only satisfy the condition that the relationship between the input signal A and the output signals E' and F' in the reference-producing circuit 21 is the same as that between the input signal A and the output signals E and F in the logic circuit 20.

Second Embodiment

A semiconductor integrated circuit according to a second embodiment of the present invention will now be described.

Figure 6:
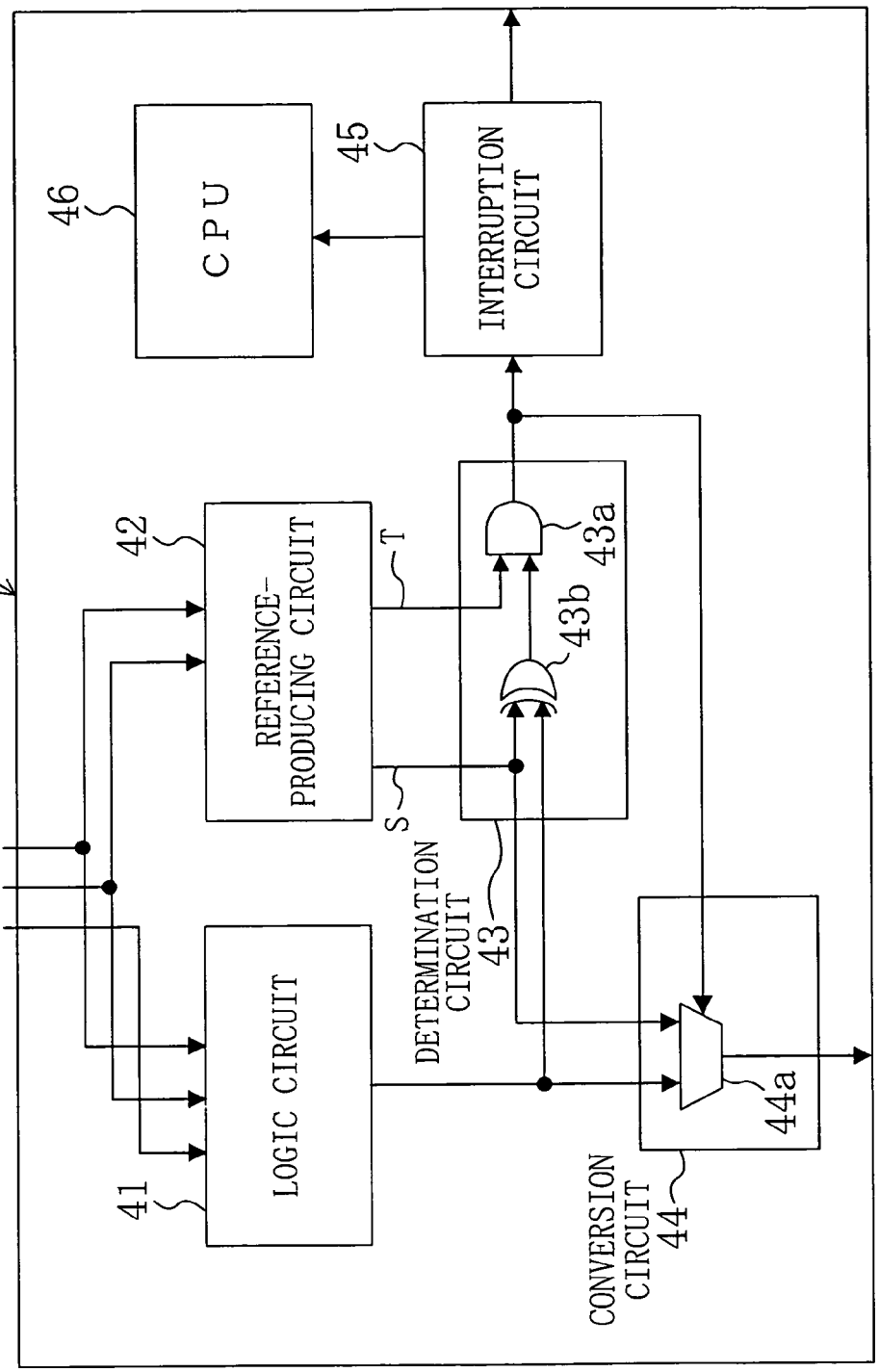
FIG. 6 is a block diagram showing a semiconductor integrated circuit according to a second embodiment of the present invention.

FIG. 6 is a block diagram showing a semiconductor integrated circuit 40 of the present embodiment. As in the first embodiment, the semiconductor integrated circuit 40 shown in FIG. 6 includes an inspected logic circuit 41, a reference-producing circuit 42 for producing the determination reference S, and a determination circuit 43.

Figure 7:
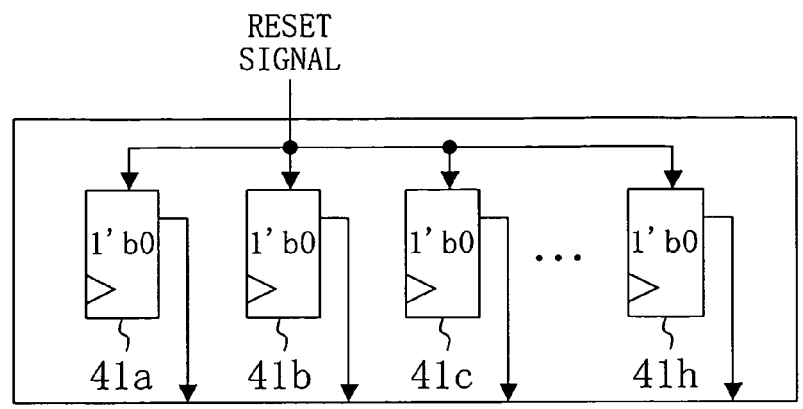
FIG. 7 shows a specific configuration of a logic circuit provided in the semiconductor integrated circuit.

FIG. 7 shows an example of an internal configuration of the inspected logic circuit 41. The logic circuit 41 shown in FIG. 7 is formed by an 8-bit register circuit including eight 1-bit flip-flop circuits 41a to 41h. The flip-flop circuits 41a to 41h are reset by receiving a common reset signal, and the register value is then initialized to "8'h00" where all of the eight bits are 0.

Where the logic circuit 41 is the 8-bit register circuit shown in FIG. 7 and where the reset state of the register circuit is important, the reference-producing circuit 42 shown in FIG. 6 is made from a logic that is totally different from the logic of the 8-bit register circuit shown in FIG. 7 and that outputs a fixed value of "8'h00" as the expected determination reference value S.

Moreover, when the reference-producing circuit 42 receives a reset signal as the input signal, the reference-producing circuit 42 outputs the reset signal as a determination period signal T, or when the reference-producing circuit 42 detects an initialization condition, under which the logic circuit 41 should be reset, based on a plurality of input signals, the reference-producing circuit 42 produces and outputs a reset signal as the determination period signal T. The reset signal (determination period signal) T is commonly input to the eight flip-flop circuits 41a to 41h of the logic circuit 41 as the reset signal shown in FIG. 7. Therefore, the determination period signal (reset signal) T specifies the period (specifically, the reset state) in which detection of an abnormality in the predetermined output signal out that is output when the logic circuit 41 of FIG. 7 is in the reset state, i.e., the output signal of "8'h00" where all of the eight bits are 0, should be performed.

The determination circuit 43 includes an AND circuit 43a and an exclusive OR circuit 43b. The exclusive OR circuit 43b receives the output signal out from the logic circuit 41 and the determination reference (expected value) S from the reference producing circuit 42 to give an output signal being an exclusive logical sum thereof, which is input to the AND circuit 43a. The AND circuit 43a also receives the determination period signal T output from the reference-producing circuit 42. The output signal from the AND circuit 43a is output to a conversion circuit 44 and an interruption circuit 45 as the output signal (the error signal Er) of the determination circuit 43.

With this configuration of the determination circuit 43, during the period (the reset state) in which failure detection should be performed, the determination period signal T is output as a signal having a logical value of 1, and the determination period signal T is input to one input terminal of the AND circuit 43a of the determination circuit 43. Therefore, the output of the AND circuit 43a is dependent on the input signal to the other input terminal thereof, i.e., the output signal from the exclusive OR circuit 43b. Thus, if the output signal out from the logic circuit 41 matches with the expected value S ("8'h00"), the output from the exclusive OR circuit 43b has a logical value of 0, thereby negating the error signal Er from the determination circuit 43. If the output signal out from the logic circuit 41 does not match with the expected value S, the output from the exclusive OR circuit 43b has a logical value of 0, thereby asserting the error signal Er from the determination circuit 43.

During the period in which failure detection is not performed (the non-reset state), the determination period signal T is output with the logical value thereof being 0, whereby the error signal Er being the output from the AND circuit 43a of the determination circuit 43 always has a logical value of 0 and is negated, irrespective of the logical value output from the exclusive OR circuit 43b.

Therefore, in the present embodiment, the output of the error signal Er from the determination circuit 43 is enabled only in the reset state where the determination period signal (reset signal) T is output. In the enabled state, if the predetermined output signal out from the inspected logic circuit 41 does not match with the expected value S ("8'h00") produced by the reference-producing circuit 42, the error signal Er from the determination circuit 43 is asserted, thereby detecting an abnormality in the output signal out from the logic circuit 41 and thus finding a failure of the semiconductor integrated circuit 40 due to deterioration with age, or the like.

The reference-producing circuit 42 produces the determination reference S with a logic of outputting a fixed value of "8'h00", totally different from the logic of the logic circuit 41 shown in FIG. 7, whereby the circuit scale thereof can be considerably smaller than that of the logic circuit 41.

Moreover, the period in which the output of the error signal Er from the determination circuit 43 is enabled is limited to the reset state in which the determination period signal T is output. Therefore, it is not necessary to additionally provide a complicated configuration for ensuring that the reference-producing circuit 42 does not produce the determination reference S in periods other than the determination period (the non-reset state). Therefore, it is possible to further simplify the configuration of the reference-producing circuit 42, and to further reduce the circuit scale of the reference-producing circuit 42. The conversion circuit 44, the interruption circuit 45 and a CPU 46 shown in FIG. 6 are similar to those shown in FIG. 1, and thus will not be further described below.

Note that while the determination period signal T is used in the present embodiment to limit the period in which the output of the error signal Er from the determination circuit 43 is enabled, the present invention is not limited to this. For example, the period in which the determination reference S is produced by the reference-producing circuit 42 may be limited by using a period determination signal. In such a case, the reference-producing circuit 42 does not operate constantly but operates only while the determination period signal T is being output, thus reducing the power consumption.

Note that in the present embodiment, the reference-producing circuit 42 is made from a logic for outputting a fixed value of "8'h00" where the reset state of the logic circuit 41 is an important function. Alternatively, if the set state of the logic circuit 41 is an important function, the reference-producing circuit 42 may be a logic for outputting, as a fixed value, the output signal in the set state.

In the first and second embodiments, the reference-producing circuit 12 or 42, the determination circuit 13 or 43, the conversion circuit 14 or 44, the interruption circuit 15 or 45 and the CPU 16 or 46 are provided in the same semiconductor integrated circuit as the logic circuit 11 or 41. Alternatively, these components may be provided in a different semiconductor integrated circuit to realize a semiconductor system having a semiconductor integrated circuit including a logic circuit and another semiconductor integrated circuit including a reference-producing circuit, etc.

Third Embodiment

Figure 8:
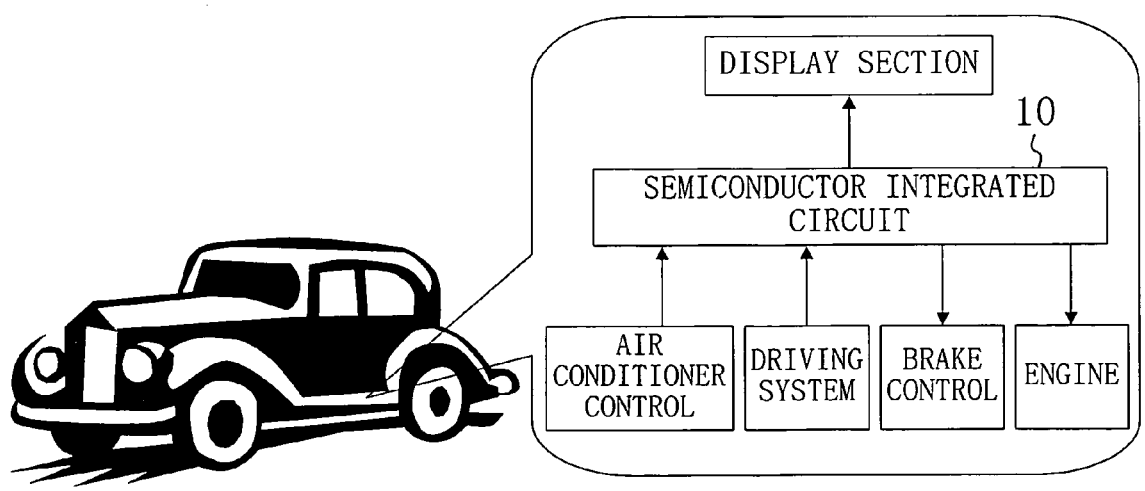
FIG. 8 shows a semiconductor system according to a third embodiment of the present invention.

FIG. 8 shows a case where a semiconductor system including the semiconductor integrated circuit of the first embodiment is used as an engine control system for an automobile.

When the engine control system detects a failure of the logic circuit 11 of the semiconductor integrated circuit 10 due to deterioration with age, or the like, the engine control system sends the error signal Er to a display section to visually indicate the failure of the semiconductor integrated circuit 10, while gradually decreasing the engine speed based on the speed information from the driving system and then braking the automobile to safely stop the automobile.

Fourth Embodiment

Figure 9:
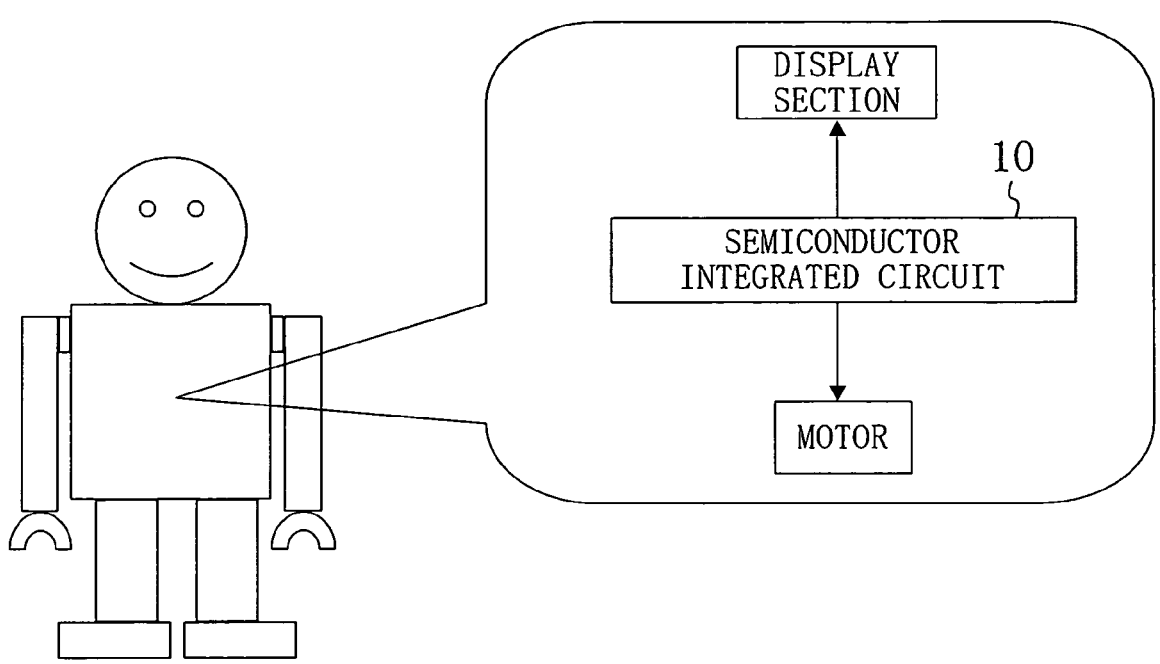
FIG. 9 shows a semiconductor system according to a fourth embodiment of the present invention.

FIG. 9 shows a case where a semiconductor system including the semiconductor integrated circuit of the first embodiment is used as a motor control system for a robot.

When the motor control system detects a failure of the logic circuit 11 of the semiconductor integrated circuit 10 due to deterioration with age, or the like, the motor control system sends the error signal Er to a display section to visually indicate the failure of the semiconductor integrated circuit 10, while stopping the motor to stop the robot.

Fifth Embodiment

Figure 10:
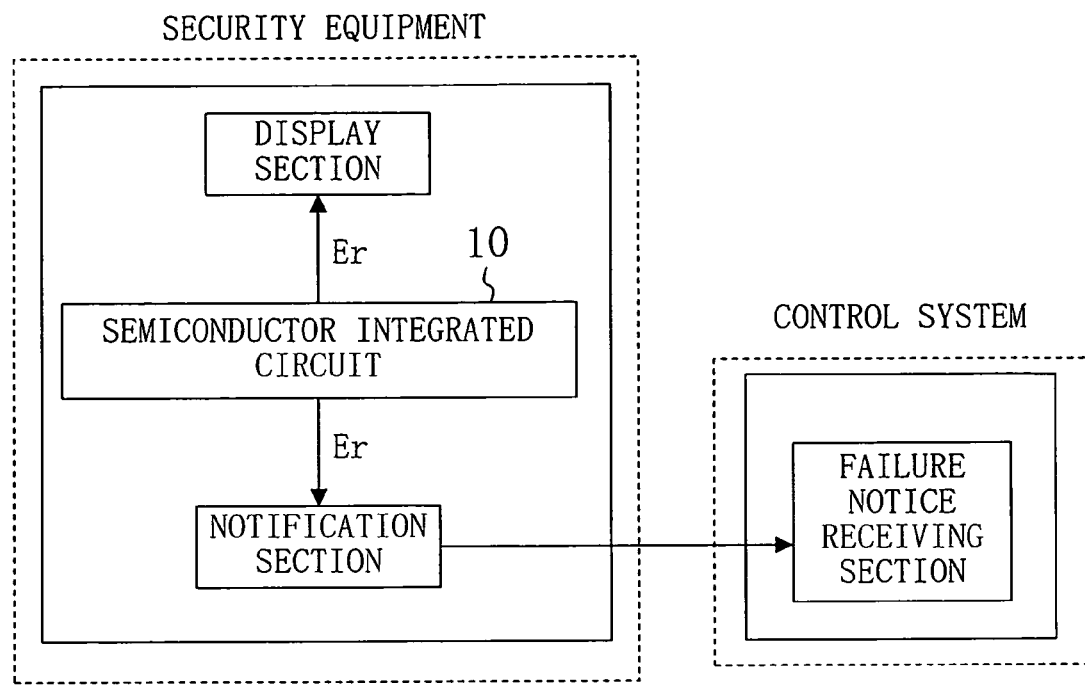
FIG. 10 shows a semiconductor system according to a fifth embodiment of the present invention.

FIG. 10 shows a case where a semiconductor system including the semiconductor integrated circuit of the first embodiment is used as a security control system.

When the security control system detects a failure of the logic circuit 11 of the semiconductor integrated circuit 10 provided in home security equipment due to deterioration with age, or the like, the security control system sends the error signal Er to a display section provided in the security equipment to visually indicate the failure of the security equipment including the semiconductor integrated circuit 10 while also sending the error signal Er to a failure notice receiving section of the security control system for the notification of the failure of the security equipment.

Sixth Embodiment

Figure 11:
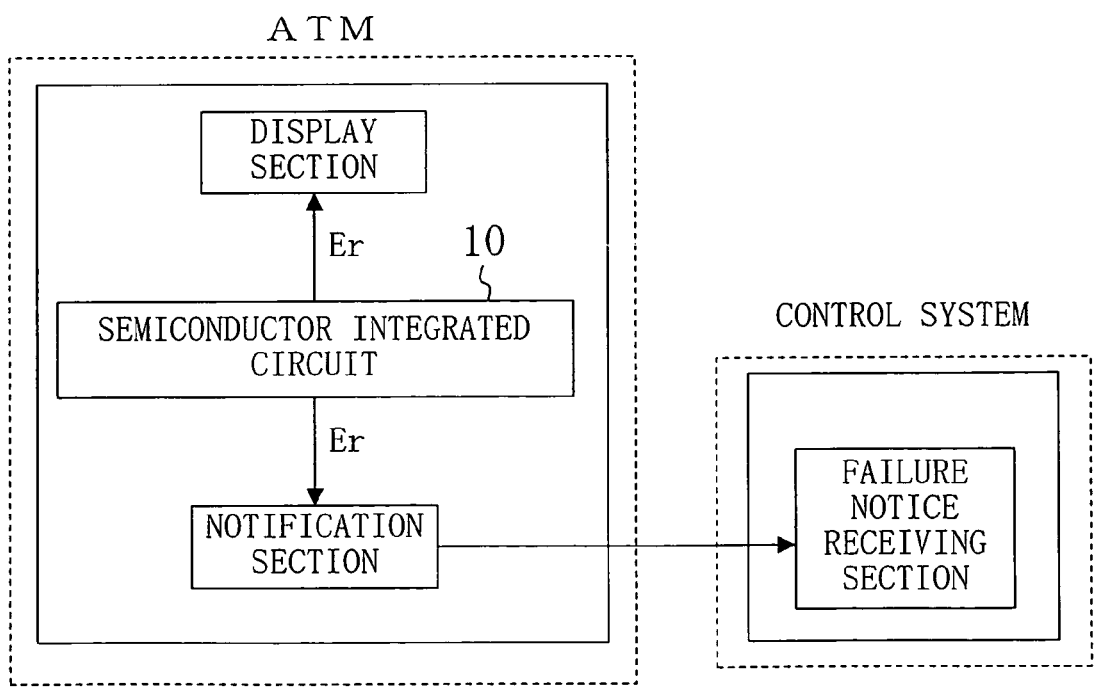
FIG. 11 shows a semiconductor system according to a sixth embodiment of the present invention.

FIG. 11 shows a case where a semiconductor system including the semiconductor integrated circuit of the first embodiment is used as an ATM control system.

When the system detects a failure of the logic circuit 11 of the semiconductor integrated circuit 10 provided in an ATM, the system sends the error signal Er to a display section of the ATM to visually indicate the failure of the semiconductor integrated circuit 10 while also sending the error signal Er to a failure notice receiving section of a control system in the bank that is managing the ATM for the notification of the failure of the ATM.

Seventh Embodiment

Figure 12:
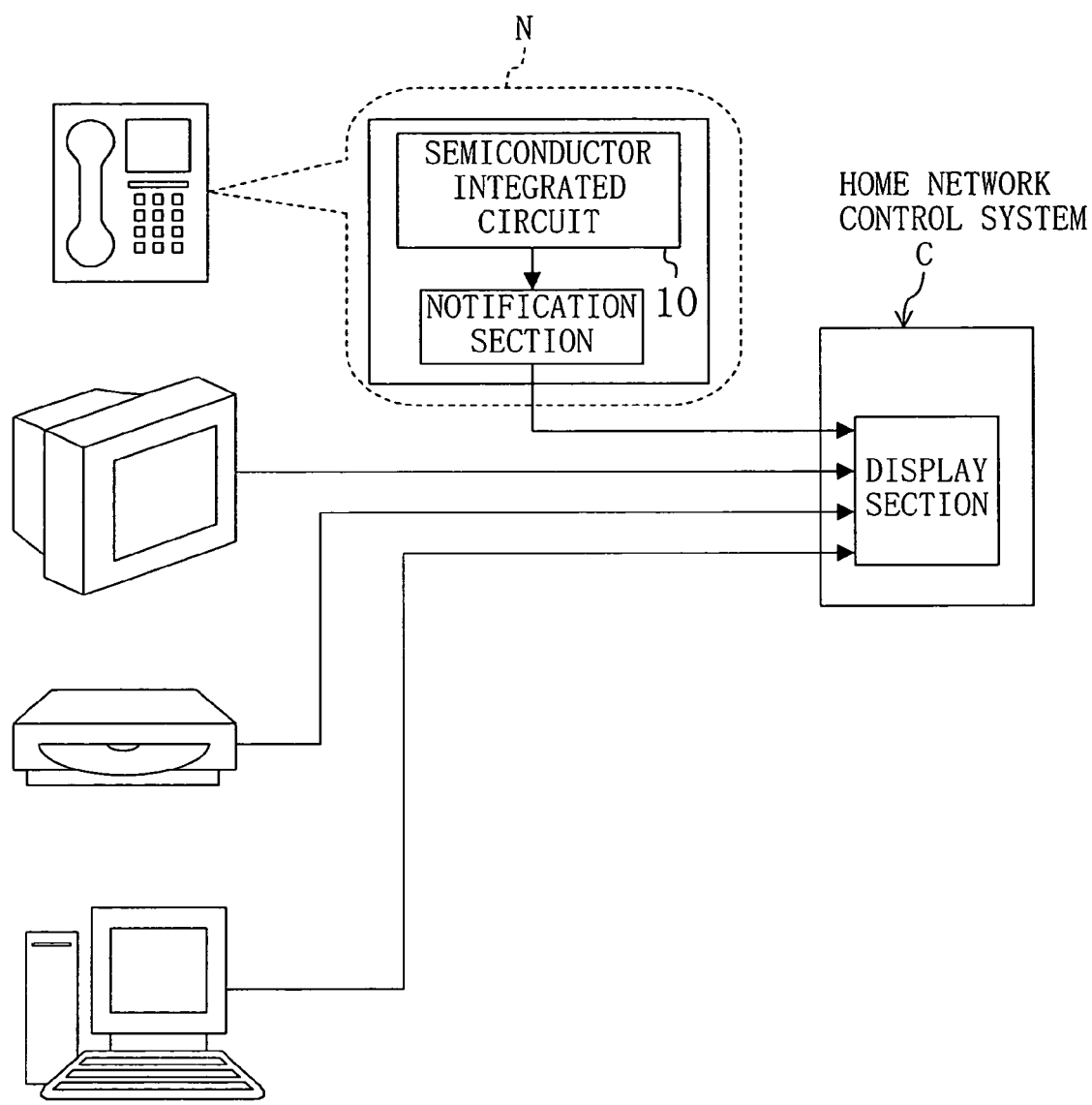
FIG. 12 shows a semiconductor system according to a seventh embodiment of the present invention.

FIG. 12 shows a case where a semiconductor system including the semiconductor integrated circuit of the first embodiment is used as a home network system.

In the present embodiment, each of the household electrical appliances, such as a telephone, a television, a DVD and a personal computer, is provided with a home network system N including the semiconductor integrated circuit 10 (only the home network system N in the telephone is shown in the figure). These home network systems are controlled by a home network control system C. For example, when a failure of the semiconductor integrated circuit 10 provided in the telephone is detected, the home network control system C is notified of the failure of the telephone. Then, the home network control system C receiving the notification visually indicates on a display section thereof that the telephone has failed while disabling operations using the telephone. In such a case, an operation that does not use the telephone can still be performed.

Note that while the semiconductor integrated circuit included in the semiconductor system is the semiconductor integrated circuit 10 shown in FIG. 1 or FIG. 3 in the third to seventh embodiments, it may alternatively be the semiconductor integrated circuit 40 shown in FIG. 6.

INDUSTRIAL APPLICABILITY

As described above, the present invention is capable of detecting a failure of an inspected logic circuit due to deterioration with age, or the like, using a small-scale reference-producing circuit for producing a determination reference without using a mirror circuit. Thus, the present invention is useful as a semiconductor integrated circuit capable of detecting a failure of a logic circuit provided therein due to deterioration with age, or the like, with little increase in the circuit area and with low power consumption.

The invention claimed is:
1. A semiconductor integrated circuit, comprising:
   a logic circuit producing at least a predetermined output signal with a logic and outputting the predetermined output signal;
   a reference-producing circuit for producing a determination reference for the predetermined output signal, wherein the reference-producing circuit is made from a different logic from the logic of the logic circuit and with a smaller circuit scale than that of the logic circuit; and a determination circuit for receiving a determination reference produced by the reference-producing circuit to detect an abnormality in the predetermined output signal from the logic circuit based on the determination reference, wherein if an abnormality is detected, the determination circuit determines that the logic circuit has failed and outputs an error signal.

2. The semiconductor integrated circuit of claim 1, wherein the reference-producing circuit produces the determination reference with the same logic as a portion of the logic of the logic circuit.

3. The semiconductor integrated circuit of claim 1, wherein the reference-producing circuit produces the determination reference with a logic totally different from the logic of the logic circuit.

4. The semiconductor integrated circuit of claim 1, wherein:

the reference-producing circuit also produces a determination period signal specifying a period during which the detection of an abnormality in the predetermined output signal from the logic circuit should be performed; and the determination circuit performs the detection of an abnormality in the predetermined output signal from the logic circuit based on the determination reference from the reference-producing circuit only while the determination period signal is being output.

5. The semiconductor integrated circuit as in any one of claims 1 to 4, comprising a conversion circuit for, in response to the error signal output from the determination circuit, externally outputting the determination reference produced by the reference-producing circuit as the predetermined output signal, instead of the predetermined output signal from the logic circuit.

6. The semiconductor integrated circuit as in any one of claims 1 to 4, comprising:

a CPU for operating the logic circuit; and an interruption circuit for halting an operation of the CPU in response to the error signal output from the determination circuit.

7. A semiconductor system, comprising:

the semiconductor integrated circuit as in any one of claims 1 to 4;

a CPU for operating the logic circuit provided in the semiconductor integrated circuit; and an interruption circuit for halting an operation of the CPU in response to the error signal output from the determination circuit provided in the semiconductor integrated circuit.

* * * * *